United States Patent
Yamashita et al.

(10) Patent No.: US 7,812,261 B2
(45) Date of Patent: Oct. 12, 2010

(54) MULTILAYER PRINTED WIRING BOARD AND TEST BODY FOR PRINTED WIRING BOARD

(75) Inventors: Takahiro Yamashita, Gifu (JP);
Hirofumi Futamura, Gifu (JP);
Akihide Ishihara, Gifu (JP); Takayoshi Katahira, Kanagawa (JP)

(73) Assignee: Ibiden Co., Ltd., Ogaki-shi (JP)

( * ) Notice: Subject to any disclaimer, the term of this patent is extended or adjusted under 35 U.S.C. 154(b) by 805 days.

(21) Appl. No.: 10/586,335

(22) PCT Filed: Jan. 17, 2005

(86) PCT No.: PCT/JP2005/000793
§ 371 (c)(1),
(2), (4) Date: Jan. 9, 2007

(87) PCT Pub. No.: WO2005/069707
PCT Pub. Date: Jul. 28, 2005

(65) Prior Publication Data
US 2007/0190846 A1 Aug. 16, 2007

(30) Foreign Application Priority Data
Jan. 16, 2004 (JP) .............................. 2004-009489

(51) Int. Cl.
*H05K 1/09* (2006.01)
(52) U.S. Cl. ..................... 174/256; 174/259; 174/260
(58) Field of Classification Search ......... 174/256–259, 174/260
See application file for complete search history.

(56) References Cited

U.S. PATENT DOCUMENTS
6,331,376 B1 * 12/2001 Kojima et al. ............ 430/284.1

FOREIGN PATENT DOCUMENTS
JP        09 125264        5/1997
(Continued)

OTHER PUBLICATIONS
Machine translation of JP 2000-340916 (Dec. 2000).*
Larry Marvet, et al., "Strain Gages Imbedded in PC Board", Motorola Technical Developments, XP000594532, vol. 27, May 1, 1996, pp. 11-12.

*Primary Examiner*—Jeremy C Norris
(74) *Attorney, Agent, or Firm*—Oblon, Spivak, McClelland, Maier & Neustadt, L.L.P.

(57) ABSTRACT

There are provided a multilayer printed circuit board and a testing piece for the printed circuit board, including a substrate having an inner-layer conductor circuit and one or more outer-layer conductor circuits formed on the substrate with an insulating layer laid between the substrate and outer-layer conductor circuit, wherein a strain gauge having a resistive element held tight between resin films formed from polyimide or thermoplastic resin is buried in the substrate, and electrodes electrically connected to the resistive element are exposed to outside from the resin film and are electrically connected at exposed portions thereof to a viahole. Even if a crack is caused by an impact test to take place in the insulative resin layer, the resin film layers prevent the crack from spreading and thus the resistive element forming the strain gauge will not be ruptured. Also, not only the information on strain in the surface layer of the circuit board but also information on strain in a desired position can be measured accurately, so that an actual stress given to the circuit board can accurately be determined.

20 Claims, 2 Drawing Sheets

FOREIGN PATENT DOCUMENTS

Figure 1:
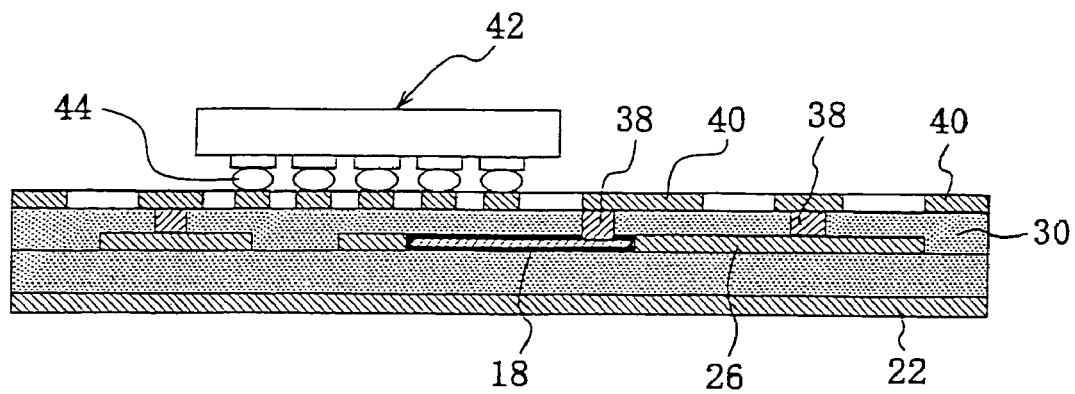

| | | |
|---|---|---|
| JP | 10-079362 | 3/1998 |
| JP | 2000-340916 | 12/2000 |
| JP | 2000 340916 | 12/2000 |
| JP | 2001 015882 | 1/2001 |

* cited by examiner

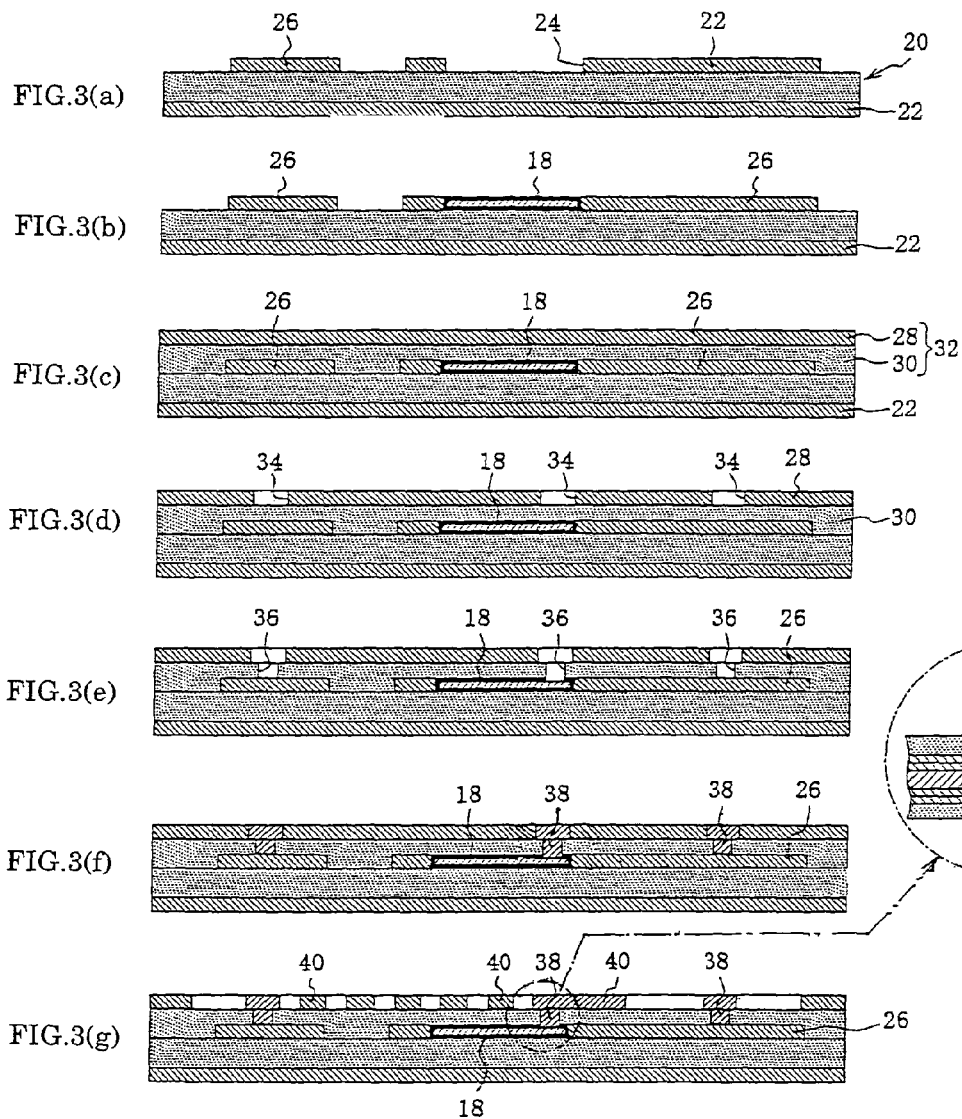

MULTILAYER PRINTED WIRING BOARD AND TEST BODY FOR PRINTED WIRING BOARD

FIELD OF THE INVENTION

The present invention relates to a multilayer printed circuit board with a strain measuring function and a testing piece for the printed circuit board.

BACKGROUND ART

Recently, it has been proposed to mount electronic components more densely in each circuit board. In particular, the recent tendency has been toward decreasing the number of solder bumps per circuit board and reducing the package size.

Along with the considerable decrease in size of the solder bumps or balls, the demand for a higher reliability on the mechanical strength of the solder joint has also become more stringent. In the recent field of this industry, as the computers have been improved very much in function, simulation of the possible stress in the printed circuit boards used in the computers has been pursued more actively. Although the manufacturers of electronic devices have actively been trying to measure possible strain in such electronic devices, it is still difficult to attain a coincidence between the simulated strain value and measured strain.

For example, the Japanese Patent Laid-Open No. 2001-15882 discloses a circuit board having a strain gauge built therein. As disclosed in this document, information on an actual stress which will possibly lead to rupture or destruction of the circuit board can be acquired by measuring the strain of the solder joints at the circuit board surface and influence of strain rate when the circuit board has been bent or applied with an impact or shock. Currently, however, it is difficult to measure the amount of strain of the solder joint. On this account, a strain gauge is disposed as near the solder joint as possible to measure the strain and the measured solder joint strain and rupture are correlated with each other.

However, since actual stress given to a circuit board cannot accurately be measured only with the information on strain of the surface layer, it is necessary to measure strain inside the circuit board. On this account, the Japanese Patent Laid-Open No. 2000-340916 proposed a circuit board in which a strain measuring metal piece highly variable in resistance is buried and electrically connected through a through-hole.

However, the above-mentioned conventional circuit boards are disadvantageous in that the resistive element is broken due to a crack developed in the insulative resin layer when strain developed due to a given impact during the impact resistance test is measured and that no accurate measurement is possible since strain occurs due to a through-hole formed to electrically connect a metal foil provided in the circuit board and measuring electrodes provided in the surface layer of the circuit board to each other.

The present invention has an object to overcome the above-mentioned drawbacks of the related art by providing a multilayer printed circuit board and a testing piece for the printed circuit board, having such an impact resistance that no crack will take place in an insulative resin layer and a resistive element will not be broken and capable of accurate strain measurement.

DISCLOSURE OF THE INVENTION

According to the present invention, there is provided a multilayer printed circuit board including a substrate having an inner-layer conductor circuit and one or more outer-layer conductor circuits formed on the substrate with an insulating layer laid between the substrate and outer-layer conductor circuit, wherein:

a strain gauge having a resistive element held tight between resin films formed from polyimide or thermoplastic resin is buried in the substrate; and electrodes electrically connected to the resistive element are exposed to outside from the resin film and are electrically connected at exposed portions thereof to a viahole.

According to the present invention, there is also provided a testing piece for the printed circuit board including a substrate having an inner-layer conductor circuit and one or more outer-layer conductor circuits formed on the substrate with an insulating layer laid between the substrate and outer-layer conductor circuit, wherein:

a strain gauge having a resistive element held tight between resin films formed from polyimide or thermoplastic resin is buried in the substrate; and electrodes electrically connected to the resistive element are exposed to outside from the resin film and are electrically connected at exposed portions thereof to a viahole.

Note that the multilayer printed circuit board and the testing piece for the printed circuit board according to the present invention will generically be referred to simply as "circuit board" hereunder.

In the circuit board according to the present invention, the resin films between which the resistive element as the strain gauge is held tight should preferably be formed from at least one selected from polyimide or thermoplastic resins such as polyester, polytetrafluoroethylene, etc.

Also, the viahole should preferably be filled with a conductive material such as electroless plating, electroplating, conductive paste or the like.

Also, the circuit board should preferably have a plurality of solder bumps or balls formed on the outermost layer thereof.

According to the present invention, the strain gauge is buried in a desired position in the circuit board and the resistive element forming the strain gauge is held tight between the resin films formed from polyimide or thermoplastic resins such as polyester, polytetrafluoroethylene or the like to have high fracture toughness. So, even if a crack takes place in the insulative resin layer during an impact test, the resin films will prevent the crack from spreading and thus the resistive element forming the strain gauge will not be broken.

Also, according to the present invention, strain information corresponding to an amount of strain given to the strain gauge buried in a desired position in the circuit board is taken to outside the circuit board via the viahole. So, it is possible to accurately measure the information on strain in the surface layer of the circuit board and information on strain at a desired place and the actual stress given to the circuit board.

Further, the viahole fully filled with the conductive material is connected to the electrodes connected to the resistive element. So, it will not be deformed largely and thus permits to accurately measure stress. Also, it can improve the electrical connection of the strain gauge to the bottom of the viahole.

These and other aspects, features, and advantages of the present invention will become more apparent from the following detailed description of the preferred embodiments of the present invention when taken in conjunction with the accompanying drawings. It should be noted that the present invention is not limited to the embodiments but can freely be modified without departing from the scope and spirit thereof defined in the claims given later.

BRIEF DESCRIPTION OF THE INVENTION

FIG. 1 is a schematic sectional view of a multilayer printed circuit board according to the present invention.

Figure 2:
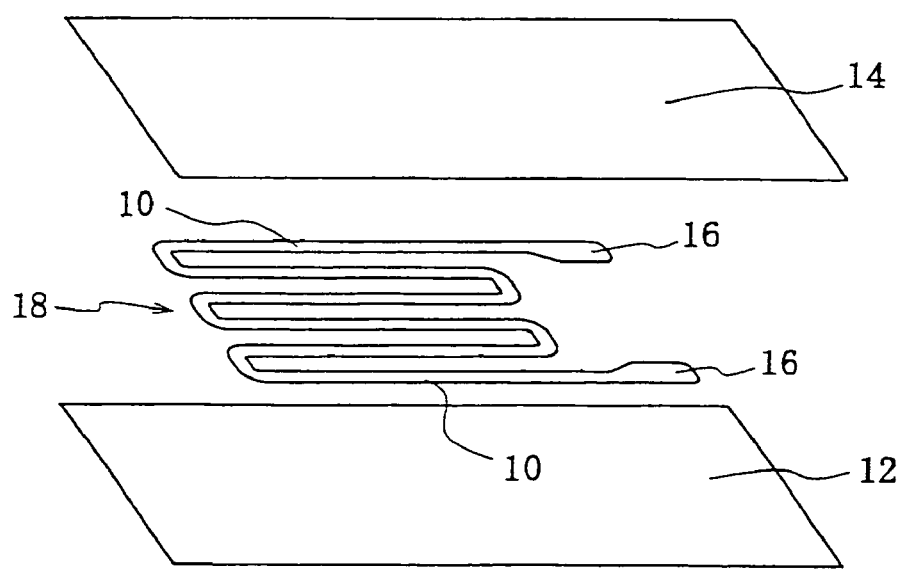

FIG. 2 schematically illustrates the structure of a strain gauge buried in the multilayer printed circuit board according to the present invention.

FIGS. 3(a) to 3(g) are process drawings showing an example of the production method for the multilayer printed circuit board according to the present invention.

BEST MODE FOR CARRYING OUT THE INVENTION

Firstly, the circuit board according to the present invention is characterized in that a strain gauge is buried in a desired position in the circuit board and a resistive element forming the strain gauge is held tight between resin films formed from polyimide or a thermoplastic resin such as polyester, polytetrafluoroethylene or the like to be excellent in fracture toughness. Secondly, the circuit board is characterized in that electrodes connected to the resistive element forming the strain gauge are exposed to outside through a part of the resin film, the exposed electrodes are electrically connected to the bottom of a viahole so that information on strain developed in the circuit board is taken to outside the circuit board through the viahole.

Conventionally, the strain gauge is disposed only on a flat portion of the circuit board and the shortest distance between the partial end of the circuit board and solder bump is at least 500 μm. Therefore, no strain gauge can be provided in a position relatively near the solder bump, so that how large the strain caused by the solder bump cannot be measured accurately.

In the circuit board according to the present invention, a strain gauge is buried in a desired position in the circuit board and the data acquisition electrodes of the strain gauge are electrically connected to the viahole. For example, a viahole exposed in a position adjacent to a solder bump provided in position on the circuit board can electrically be connected to a strain gauge located nearly beneath the solder bump. Thus, information on strain caused by the solder bump can be taken out through the viahole, which will assure accurate measurement of the strain. That is, even if the shortest distance between the partial end of the circuit board and solder bump is less than 500 μm, the strain can be measured.

Also, it should be noted herein that a pre-formed strain gauge buried in the circuit board can provide more accurate strain data than that measured by a strain gauge formed during production of a circuit board or during forming of a circuit board pattern. The strain gauge formed during production of the circuit board cannot possibly measure strain accurately because of its partial defect or because it cannot be formed in any desired shape.

The circuit board according to the present invention is a multilayer printed circuit board formed by stacking a plurality of copper-clad laminates each including a thin substrate formed from a glass-epoxy resin or the like and a copper clad attached to one or either side of the substrate and which has an arbitrary number of strain gauges disposed in arbitrary positions and directed arbitrarily on an inner layer thereof.

Here will be explained the theory of the strain measurement, adopted in the present invention. The strain gauge is formed from a resistive element (resistive metal foil) as strain-sensitive element. The strain-sensitive element is caused by strain to expand or shrink. When mechanically expanded and shrunk, many of metals have the electrical resistance changed. Since the rate of change of the electrical resistance is proportional with strain according to a certain proportionality constant, measurement of a small change in electrical resistance results in strain measurement.

The above can be mathematized as follows:

$$\Delta R/R = K \cdot \epsilon = K \cdot \Delta L/L$$

where R: Initial resistance (in Ω) of the strain gauge (normally 120Ω),

R: Change of the resistance, caused by expansion or shrink (in Ω)

L: Initial length of the strain gauge

ΔL: Expansion or shrink of the strain gauge

K: Proportionality constant (gauge factor) (normally around 2.1)

ε: Strain

The strain gauge is formed as a Wheatstone bridge in which a voltage applied to the resistive element is measured to calculate a difference in resistance between before and after strain develops and then the strain is calculated from the calculated difference in resistance.

The resistive element may be formed from a metal foil of copper-nickel alloy, nickel alloy or a nickel-chrome alloy. The alloys change greatly in resistance in relation to their elongation percentage and are highly sensitive to stain.

In the circuit board according to the present invention, a desired number of strain gauges can be buried in desired positions in the circuit board and in desired directions, respectively. So, with acquisition of only information on strain of a surface layer of the circuit board, it is possible to accurately measure an actual stress distribution in the circuit board.

Also, it should be noted herein that strain data measured by the pre-formed strain gauges buried in the circuit board is more accurate than that measured by strain gauges formed during production of a circuit board or during forming of a circuit board pattern. The strain gauges formed during production of the circuit board cannot possibly measure strain accurately because of their partial defect or because they cannot be formed in any desired shape.

The electrodes connected to the resistive element forming the strain gauge buried in the circuit board, that is, the data acquisition electrodes, are electrically connected to the bottom of a viahole, and thus the strain gauge can electrically be accessed from the circuit board surface via the viahole and the viahole itself takes only a very small inner portion of the circuit board. So, if an external shock is given to the circuit board, the latter will not be deformed excessively and only strain caused by the shock can accurately be measured.

Also, since the resistive element forming the strain gauge is held tight between resin films formed from polyimide or a thermoplastic resin such as polyester, polytetrafluoroethylene or the like to have a high fracture toughness, even if a large stress given to the resin films (insulative resin layer) in an impact test or the like to cause a crack, the buffer action of the resin films will prevent the crack from being larger. The resistive element forming the strain gauge will not be broken or damaged due to such a shock.

The resin film should preferably be formed from at least one selected from among polyimide and thermoplastic resins such as polyester and polytetrafluoroethylene.

The polyimide or thermoplastic resin is preferable because it can prevent the strain gauge from being deformed excessively by an external force or shock and transmit only strain caused by a shock to the strain gauge.

Note that the circuit board according to the present invention should preferably have a plurality of solder bumps or balls formed on the outermost layer thereof because the strain gauge can effectively measure strain caused by solder pieces such as the plurality of solder bumps.

Also, in the circuit board according to the present invention, the viahole should preferably be formed from an electrically conductive material such as electroless plating, electroplating, conductive paste or the like fully filled in an opening formed for the viahole. The conductive material fully filled in the opening can further reduce the deformable portion of the circuit board, which permits a more accurate measurement of strain. Also, the conductive material thus filled in the viahole opening improves the electrical connection between the electrodes connected to the resistive element and the viahole bottom.

Also, the opening for the viahole should preferably be formed by irradiating a laser to the insulative resin layer or by exposing and developing the photosensitive resin, and be plated for the viahole to be electrically conductive. Since the lasering or exposure and development to form the viahole opening results in no large strain as in drilling, the viahole thus formed will have a high dimensional accuracy.

Also, the circuit board according to the present invention should preferably have a plurality of strain gauges formed therein because they will be able to measure the distribution of strain accurately.

Further, the circuit board according to the present invention is not only a multilayer printed circuit board having strain gauges formed therein but can be used as a testing piece to measure strain or demonstrate the coincidence between the actual strain in a circuit board and the results of strain simulation made prior to the actual production of the circuit board.

An example of the method of producing the circuit board according to the present invention will be explained in detail below.

(1) A metallic foil of copper-nickel alloy or nickel-chrome alloy is etched with an aqueous solution of hydrofluoric acid and nitric acid to form a lattice-shaped resistive element 10.

(2) The resistive element 10 is placed on a polyimide film 12, a polyester film 14 is placed over the resistive element 10, they are hot-pressed at a temperature of 50 to 150° C. to hold tight the resistive element 10 between the films 12 and 14, thereby forming a strain gauge 18 (as in FIG. 2).

(3) Next, a copper foil 22 on a copper-clad laminate 20 is etched to form a strain gauge receptacle 24 and an inner-layer conductor circuit pattern 26 (as in FIG. 3(*a*)). Thereafter, the strain gauge 18 formed in the above step (2) in the strain gauge receptacle 24 (as in FIG. 3(*b*)). The strain gauge 18 should desirably be joined to the resin surface with an epoxy resin or the like in order to prevent the strain gauge 18 from being disengaged from the strain gauge receptacle 24 in the course of the circuit board production.

(4) On a surface of the circuit board formed in the above step (3) where the strain gauge receptacle 24 is formed, a resin-applied copper foil 32 formed from a copper foil 28 having a resin film 30 laminated thereon is stacked with the surface of the resin film 30 being opposite to the circuit board surface. They are hot-pressed at a temperature of 80 to 150° C. under a pressure of 50 to 100 kg/cm² (as in FIG. 3(*c*)).

(5) Further, the copper foil surface of the circuit board integrally formed in the above step (4) is etched with an aqueous solution of cupric chloride or the like to form laser-incident opening 34 (as in FIG. 3(*d*)) in positions corresponding to a conductive pad as a part of the inner-layer conductor circuit pattern 26 formed in the step (2) and data acquisition electrodes 16 of the resistive element 10. Then, a carbon dioxide laser, ultraviolet laser or the like is irradiated to the insulative resin layer exposed through the openings 34 to remove the resin, thereby forming fine holes 36 for viaholes (as in FIG. 3(*e*)).

Note that the laser-incident openings 34 formed by etching in the copper foil should preferably have a diameter of 30 to 100 μm. If the diameter is smaller than 30 μm, it will be difficult to fill the conductive material in the openings 34 for the electrical connection. Also, if the diameter is larger than 100 μm, strain development cannot be prevented during working of the circuit board.

Also, the diameter of the fine holes 36 for the viaholes, formed by lasering in the resin layer, should preferably be a little smaller than the diameter of the laser-incident openings 34 and fall within a range of 25 and 100 μm.

If the diameter of the fine holes 36 is smaller than 25 μm, the electrical connection will be difficult. Also, if the diameter exceeds 100 μm, the circuit board will be deformed over a larger portion thereof, resulting in a deviation of strain information.

Also, it is preferable that for forming the openings 34 by lasering, a portion of the resin film 14 covering the resistive element 10 should be removed to expose end portions of the resistive element 10 through the openings 34 in the resin film 14 and the exposed end portions be used as the data acquisition electrodes 16 of the resistive element 10.

(6) The laser-formed fine holes 36 and laser-incident openings 34 are fully filled with electroless plating, electroplating or conductive paste to form filled viaholes 38 (as in FIG. 3(*f*)).

The filled viaholes 38 are electrically connected to the conductive pad on the inner-layer conductor circuit pattern 26 or data acquisition electrodes 16 of the resistive element 10, formed in the aforementioned step (5) to enable the electrical connection to the data acquisition electrodes 16 from the outer surface of the circuit board.

(7) Next, a photoresist is laminated over the electroless plating layer formed on the surface of the circuit board, exposed and developed to form an etching resist, the etching resist is etched to form an outer-layer conductor circuit pattern 40 including viahole lands (as in FIG. 3(*g*)).

(8) Further, solder bumps or solder balls 44 on which a semiconductor, package 42 such as CSP and the like is to be mounted are disposed on the outer-layer conductor circuit pattern 40 corresponding to the filled viaholes 38 as necessary, to thereby produce the circuit board according to the present invention (as in FIG. 1).

The present invention will be explained in further detail below concerning the examples thereof:

Example 1

(1) An Ni—Cu alloy foil of 4 to 6 μm in thickness ("ADVANCE" by Tokyo Wire Works Co. Ltd.) was etched with an aqueous solution of hydrofluoric acid and nitric acid to provide a resistive element.

(2) The resistive element was placed on a polyimide film of 12 to 14 μm in thickness ("CAPTOM" by DuPont-Toray Co., Ltd.), and a polyester film of 8 to 10 μm in thickness ("DIAFOIL H type" by Mitsubishi Plastics Industries Limited) was laminated on the resistive element. They were hot-pressed at 100° C. under a pressure of 50 kg/cm$^2$, and further contoured to provide a strain gauge of 20×20 mm in size.

(3) A photoresist was laminated on the surface of a double-sided copper-clad laminate ("R1766" by Matsushita Electric Works, Ltd.), and they were exposed and developed to provide an etching resist.

(4) The copper foil was etched with an aqueous solution of 1N cupric chloride to form an inner-layer conductor circuit pattern and a strain gauge receptacle of 20×20 mm in size.

(5) Uncured epoxy resin was used to join the strain gauge to the strain gauge receptacle and they were cured at 100° C. for 3 hours.

(6) A copper foil with resin of 82 μm in thickness (copper foil thickness was 12 μm; "R0880" by Matsushita Electric Works, Ltd.), was placed on the double-sided copper-clad laminate. They were pressed at 120° C. under a pressure of 80 kg/cm$^2$ to integrate them with each other.

(7) The photoresist was laminated on the copper foil, exposed and developed to provide an etching resist. The copper foil was etched with an aqueous solution of 1N cupric chloride, and the etching resist was removed to form a lasering opening having a diameter of 100 μm.

(8) A carbon dioxide gas laser irradiator ("LCO IC21" by Hitachi, Ltd.) was used to irradiate laser for 16.8 mJ with bursting through the openings formed in the above step (7) to form fine holes of about 100 μm in diameter for viaholes in the resistive resin layer. At this time, the polyester resin was also removed to expose a part of the data acquisition electrodes of the resistive element to outside.

(9) Electroless plating was conducted in the following plating solution under the following conditions to form electroless copper plating on the inner wall surface of each of the file holes for viaholes, thereby forming the viaholes. Also, electroless copper plating was formed on the surface of the data acquisition terminals of the resistive element to electrically connect the viahole and data acquisition terminals.

Electroless plating solution:

| | |
|---|---|
| Tartaric acid | 0.200 mol/l |
| Copper sulfate | 0.03 mol/l |
| HCHO | 0.050 mol/l |
| NaOH | 0.100 mol/l |
| α—α' bipyridyl | 40 mg/l |
| Polyethylene glycol (PEG) | 0.10 g/l |

Electroless plating conditions:
Immersion in plating solution at 35° C. for 40 min

(10) A photoresist was laminated over the electroless plating formed in the above step (9), exposed and developed to form an etching resist. The electroless plating was etched with an aqueous solution of 1N cupric chloride to form an outer-layer conductor circuit including viahole lands, thereby producing a multilayer printed circuit board.

Example 2

A multilayer printed circuit board was produced similarly to the embodiment 1 except that the strain gauge was formed by stacking a polyester film of 8 to 10 μm ("CAPCOM" by DuPont-Toray Ltd.) on either side of the resistive element.

Example 3

A multilayer printed circuit board was produced similarly to the embodiment 1 except that the strain gauge was formed by stacking a polyimide film of 12 to 14 μm ("DIAFOIL H type" by Mitsubishi Plastics Industries Limited) on either side of the resistive element.

Example 4

A multilayer printed circuit board was produced similarly to the embodiment 1 except that the strain gauge was formed by stacking a polytetrafluoroethylene film of 10 to 13 μm on either side of the resistive element.

Example 5

A multilayer printed circuit board was produced generally similarly to the embodiment 1 except that electroless copper plating was conducted in the following plating solution under the following conditions to fill electroless plating in the viaholes, thereby forming a so-called filled viaholes.

Electroless plating solution:

| | |
|---|---|
| Tartaric acid | 0.200 mol/l |
| Copper sulfate | 0.03 mol/l |
| HCHO | 0.050 mol/l |
| NaOH | 0.100 mol/l |
| α—α' bipyridyl | 40 mg/l |
| Polyethylene glycol (PEG) | 0.10 g/l |
| Thiocarbamide | 10 mg/l |

Electroless plating conditions:
Immersion in plating solution at 35° C. for 48 min Comparative Example 1

(1) A photoresist was laminated on the surface of a double-sided copper-clad laminate ("R1766" by Matsushita Electric Works, Ltd.), and they were exposed and developed to provide an etching resist.

(2) The copper foil was etched with an aqueous solution of 1N cupric chloride to form an inner-layer conductor pattern and a pattern portion where a strain gauge was to be formed.

(3) An etching resist was applied to other than the pattern portion where the strain gauge was to be formed, and the assembly was immersed in a nickel plating solution having the following composition to nickel-plate the pattern portion, thereby forming a strain gauge pattern (resistive element).

Electroless plating solution:

| | |
|---|---|
| Nickel sulfate | 0.1 mol/l |
| NaH$_2$PO$_2$ | 0.2 mol/l |
| Sodium tartrate | 0.2 mol/l |
| NaOH | 0.04 mol/l (pH = 10) |

Electroless plating conditions:
Immersion in plating solution at 80° C. for 25 min (4) A copper foil with resin of 82 μm in thickness (copper foil thickness was 12 μm; "R0880" by Matsushita Electric Works, Ltd.), was placed on the double-sided copper-clad laminate. They were pressed at 120° C. under a pressure of 80 kg/cm$^2$ to integrate them with each other.

(5) With a drill, through-holes were formed through the strain gauge pattern portion at the electrodes (in 2 places).

(6) Electroless copper plating was conducted in the following plating solution having under the following plating conditions to form electroless copper plating on the inner wall surface of the through-holes:

Electroless plating solution:

| | |
|---|---|
| Tartaric acid | 0.200 mol/l |
| Copper sulfate | 0.03 mol/l |
| HCHO | 0.050 mol/l |
| NaOH | 0.100 mol/l |
| α—α' bipyridyl | 40 mg/l |
| Polyethylene glycol (PEG) | 0.10 g/l |

Electroless plating conditions:

Immersion in plating solution at 35° C. for 40 min (7) A photoresist was laminated over the copper foil with the epoxy resin, exposed and developed to form an etching resist. The copper foil was etched with an aqueous solution of 1N cupric chloride to form an outer-layer conductor circuit, thereby producing a multilayer printed circuit board in which the epoxy resin insulation layer was in direct contact with the strain gauge pattern (resistive element).

Comparative Example 2

A multilayer printed circuit board in which a glass-epoxy resin insulation layer was in direct contact with the strain gauge pattern (resistive element) similarly to the example 1 except that in the above step (2), a copper foil (of 20 µm in thickness) with a 55 µm-thick glass-epoxy resin was placed on the double-sided copper-clad laminate, they was pressed at 120° C. under a pressure of 80 kg/cm² to integrate them with each other.

The multilayer printed circuit boards produced as the aforementioned examples 1 to 5 and comparative examples 1 and 2 were to the following evaluation tests:

Strain measurement:

With the resistive element being energized through the Wheatstone bridge, a small resistance change was measured, the measured resistance change was converted into an amount of strain, and the strain was measured at two points, surface layer and a layer beneath the surface layer, of each of the example 1 (connection with the strain gauge through the viahole) and comparative example 1 (connection with the strain gauge through the through-hole), as shown in FIG. 3. The results of measurement, that is, the calculated strain of the resistive element, strain measured in each of the measuring points, measured strain of the example 1 and comparative example 1, and difference between the measured strain and calculated strain are as shown in Table 1.

TABLE 1

| | | Example 1 | | Comparative example 1 | |
|---|---|---|---|---|---|
| Measuring point | Calculated strain ($\epsilon_0$) | Measured strain ($\epsilon_1$) | Difference from calculated strain (%) * | Measured strain ($\epsilon_2$) | Difference from calculated strain (%) * |
| Surface layer | 0.001239 | 0.001224 | −1.2 | 0.001158 | −6.5 |
| Layer beneath surface layer | 0.001263 | 0.001255 | 0.6 | 0.001217 | −3.6 |

* The difference from the calculated strain was calculated by $(\epsilon_n - \epsilon_0)/\epsilon_0 \times 100$ In the example 1, the difference from the calculated strain is less than 1.5%, which means that the strain could be measured accurately. In the comparative example 1, the difference from the calculated strain was more than 3.0%, which means that the strain could not be measured accurately.

Therefore, the connection with the strain gauge through the through-hole is likely to cause an error. That is, the structure of the through-hole itself has an influence on the strain. On the contrary, the connection with the strain gauge through the viahole permits accurate strain measurement with less influence on the strain.

Drop Test

The examples 1 to 5 and comparative examples 1 and 2 were subjected to the drip test defined in the JEDEC Standard (JESD 22B111 "Drop Test") in order to check for breaking of the resistance element. After the drop test, it was checked by an optical microscope whether crack occurred in the insulative resin layer adjacent to the strain gauge. The results of these tests are as shown in Table 2.

TABLE 2

| | Material of base film | Material of protective film | Shape of viahole | Occurrence of breaking of resistive element at dropping repeated: (*Note) | | | | |
|---|---|---|---|---|---|---|---|---|
| | | | | 50 times | 100 times | 200 times | 300 times | 500 times |
| Example 1 | Polyimide | Polyester | Normal LVH | Good | Good | Good | Good | Bad |
| Example 2 | Polyester | Polyester | Normal LVH | Good | Good | Good | Bad | Bad |

TABLE 2-continued

| | Material of base film | Material of protective film | Shape of viahole | Occurrence of breaking of resistive element at dropping repeated: (*Note) | | | | |
|---|---|---|---|---|---|---|---|---|
| | | | | 50 times | 100 times | 200 times | 300 times | 500 times |
| Example 3 | Polyimide | Polyimide | Normal LVH | Good | Good | Good | Good | Bad |
| Example 4 | Polytetra-fluoro-ethylene | Polytetra-fluoro-ethylene | Normal LVH | Good | Good | Good | Bad | Bad |
| Example 5 | Polyimide | Polyester | Filled via | Good | Good | Good | Good | Good |
| Comparative example 1 | Glass-epoxy | Epoxy | Normal LVH | Good | Bad | Bad | Bad | Bad |
| Comparative example 2 | Glass-epoxy | Glass-epoxy | Normal LVH | Good | Good | Bad | Bad | Bad |

*Good: No breaking found; Bad: Breaking found

In the examples 1 to 5, no breaking was found in the resistive element (strain measuring point) even after 200 times of dropping. Especially in the example 5 in which the resistive element is electrically connected through the filled viahole, no breaking was found eve after 500 times of dropping, which proved that the example 5 is extremely excellent in impact resistance.

The above results are considered to be owe to the fact that the resistive element is so held tight between the thermoplastic resin layers of polyimide or polyester that it can be protected against breaking under the buffer action of the protective film of thermoplastic resin even when the insulative resin layer of glass-epoxy resin or epoxy resin is applied with a large stress and thus strain can be measured even when a large shock is given.

With the microscopic observation after 300 times of dropping, no crack was found in the examples 1, 3 and 5 but small crack was found in the examples 2 and 4.

On the other hand, breaking and crack were found in the comparative examples 1 and 2 after 100 to 200 times of dropping.

For the drop test, a G sensor (low-impedance sensor by Kisler) was installed to a metallic jig, the height of free drop was adjusted to about 100 cm for the acceleration speed (at which the impact reaches the maximum peak) to be 1500 G and pulse width (at a height of maximum peak×10%) to be 0.5 ms. After that, the multilayer printed circuit board as a test sample was installed on the metallic jig, and it was checked at 50, 100, 200, 300 and 500 times of dropping whether breaking occurred in the resistive element in the test sample.

To check for breaking, a wiring cable led from the electrodes (data acquisition elements) connected to the resistive element to outside the circuit board was connected to an event detector. When the event detector read a resistance over 1500Ω, it was determined that "breaking" had occurred in the resistive element.

INDUSTRIAL APPLICABILITY

As having been described in the foregoing, the present invention is directed to a multilayer printed circuit board and a testing piece for the printed circuit board. The strain gauge formed from the resistive element held tight between the thermoplastic resin films is buried in the circuit board, and is electrically connected to the viahole formed in the circuit board with the resistive element being exposed to outside from the resin film. Since the present invention permits to accurately measure the strain taking place beneath a part mounted on the circuit board, such as CSP or the like, or at a solder joint, it is advantageously usable to evaluate circuit boards and parts mounted thereon.

The invention claimed is:

1. A multilayer printed circuit board comprising:
   a substrate having an inner-layer conductor circuit formed inside the substrate and an outer-layer conductor circuit formed on the substrate;
   a strain gauge formed inside the substrate and comprising a plurality of resin films and a resistive element held between the resin films, each of the resin films comprising one of polyimide and a thermoplastic resin; and
   a plurality of electrodes electrically connected to the resistive element and exposed from one of the resin films; and
   a plurality of viaholes electrically connected to the electrodes, respectively, through the one of the resin films.

2. The multilayer printed circuit board according to claim 1, wherein each of the resin films comprises one selected from the group consisting of polyimide, polyester, and polytetrafluoroethylene.

3. The multilayer printed circuit board according to claim 2, further comprising an outermost layer formed on the substrate and a plurality of solder bumps or balls formed on the outermost layer.

4. The multilayer printed circuit board according to claim 1 or 2, wherein the viahole is filled with a conductive material.

5. The multilayer printed circuit board according to claim 4, further comprising an outermost layer formed on the substrate and a plurality of solder bumps or balls formed on the outermost layer.

6. The multilayer printed circuit board according to claim 1, further comprising an outermost layer formed on the substrate and a plurality of solder bumps or balls formed on the outermost layer.

7. The multilayer printed circuit board according to claim 1, wherein the resistive element of the strain gauge comprises a metallic foil having a lattice shape.

8. The multilayer printed circuit board according to claim 1, wherein the resistive element of the strain gauge has a plurality of portions formed as the plurality of electrodes.

9. The multilayer printed circuit board according to claim 1, wherein the substrate comprises a plurality of insulating layers, and the inner-layer conductor circuit and the strain gauge are provided between the insulating layers.

10. The multilayer printed circuit board according to claim 1, wherein the resistive element is laminated between the resin films by hot-press such that the resistive element is held tight between the resin films.

11. A testing piece for a printed circuit board comprising:
a substrate having an inner-layer conductor circuit formed inside the substrate and an outer-layer conductor circuit formed on the substrate;
a strain gauge formed inside the substrate and comprising a plurality of resin films and a resistive element held between the resin films, each of the resin films comprising one of polyimide and a thermoplastic resin;
a plurality of electrodes electrically connected to the resistive element and exposed from one of the resin films; and
a plurality of viaholes electrically connected to the electrodes, respectively, through the one of the resin films.

12. The testing piece for the printed circuit board according to claim 11, wherein each of the resin films comprises one selected from polyimide, polyester, and polytetrafluoroethylene.

13. The test piece according to claim 12, further comprising an outermost layer formed on the substrate and a plurality of solder bumps or balls formed on the outermost layer.

14. The testing piece according to claim 11 or 12, wherein the viahole is filled with a conductive material.

15. The test piece according to claim 10, further comprising an outermost layer formed on the substrate and a plurality of solder bumps or balls formed on the outermost layer.

16. The testing piece according to claim 11, further comprising an outermost layer formed on the substrate and a plurality of solder bumps or balls formed on the outermost layer.

17. The multilayer printed circuit board according to claim 11, wherein the resistive element of the strain gauge comprises a metallic foil having a lattice shape.

18. The multilayer printed circuit board according to claim 11, wherein the resistive element of the strain gauge has a plurality of portions formed as the plurality of electrodes.

19. The multilayer printed circuit board according to claim 11, wherein the substrate comprises a plurality of insulating layers, and the inner-layer conductor circuit and the strain gauge are provided between the insulating layers.

20. The multilayer printed circuit board according to claim 11, wherein the resistive element is laminated between the resin films by hot-press such that the resistive element is held tight between the resin films.

\* \* \* \* \*